United States Patent [19]

Meusel et al.

[11] Patent Number: 5,070,430
[45] Date of Patent: Dec. 3, 1991

[54] ELECTRICAL INSTALLATION COMPOSED OF INDIVIDUAL SUBASSEMBLIES

[75] Inventors: Otto Meusel, Erlangen; Josef Burger, Schmidgaden; Günther Deinhardt, Amberg; Reinhard Schirbl, Schwandorf, all of Fed. Rep. of Germany

[73] Assignee: Siemens Aktiengesellschaft, Berlin & Munich, Fed. Rep. of Germany

[21] Appl. No.: 584,295

[22] Filed: Sep. 18, 1990

[30] Foreign Application Priority Data

Sep. 25, 1989 [EP] European Pat. Off. ........ 89117656.2

[51] Int. Cl.$^5$ .............................................. H01R 9/00
[52] U.S. Cl. .................................... 361/407; 361/413; 361/415
[58] Field of Search ............... 361/392, 393, 394, 399, 361/407, 412, 413, 415, 425, 426; 439/532, 534, 536, 540, 544, 545

[56] References Cited

U.S. PATENT DOCUMENTS 3,992,654 11/1976 Springer et al. ..................... 361/415
4,659,165 4/1987 Glomb et al. ........................ 439/176
4,738,632 4/1988 Schmidt et al. ..................... 361/393

FOREIGN PATENT DOCUMENTS 0181492 5/1986 European Pat. Off. .
8415458 3/1986 Fed. Rep. of Germany .

OTHER PUBLICATIONS

IBM Technical Disclosure Bulletin, vol. 26, No. 3b, Aug. 1983, New York, US, pp. 1468-1469, B. Sassen, "Connector Alignment Block".

Primary Examiner—Leo P. Picard
Assistant Examiner—Donald A. Sparks
Attorney, Agent, or Firm—Kenyon & Kenyon

[57] ABSTRACT

An electrical installation is composed of individual subassemblies with a subrack, and the relative positional accuracy needed to unite the plug-in and mating connections. Furthermore, a plastic holder featuring a hole to accommodate the plug-in connections is provided on the subrack, and a spring part is provided at a defined distance to this hole. Positioning holes are available on a bus board belonging to the subrack at a defined distance from the plug-in connections. At least two projections adapted in position and shape to the positioning holes are provided on the side of the plastic holder turned away from the subassemblies. In the joined state of the bus board and the plastic holder, the plug-in connections extend into the holes. The subassemblies are brought by the spring part over a support part into a position suited for sliding the mating connections on to the plug-in connections.

28 Claims, 5 Drawing Sheets

0
ELECTRICAL INSTALLATION COMPOSED OF INDIVIDUAL SUBASSEMBLIES

BACKGROUND OF THE INVENTION

The present invention relates to an electrical installation and more particularly to an installation composed of individual subassemblies and with a subrack featuring a bus printed circuit board (bus board).

Secured to this bus board are plug-in connections, which are able to be electrically connected through swivel means to mating connections of the subassemblies and on which the subassemblies are mechanically retained at the subrack. The subrack consists of a metal profile plate featuring a pivotal mounting support for the subassemblies. The plug-in connections, which are connected to the mating connections of the subassemblies in their pivoted state, are connected by way of the bus board to the profile plate. The positional accuracy of the plug-in connections and of the mating connections to each other is determined in this case, however, by the overall tolerances of the plug-in connection attachment, the bus board, the profile plate, the pivotal mounting support for the subassemblies and the attachment of the mating connections. The positional accuracy is not as advantageous as is desired.

SUMMARY OF THE INVENTION

The present invention improves the positional accuracy of the plug-in and mating connections, which is required for the contact connection in an installation composed of individual subassemblies with a subrack featuring a bus board.

The present invention provides this positional accuracy by providing the following features in the installation configuration of the above-mentioned type.

The subrack possesses a plastic holder. The plastic holder features at least one hole to accommodate the plug-in connections. At least one first projection is provided on the plastic holder at a defined distance to the hole. At a defined distance from the plug-in connections, the bus board features at least two positioning holes. At least two second projections adapted in position and shape to the positioning holes are provided on the side of the plastic holder turned away from the subassemblies. The second projections and positioning holes are positioned, so that in their joined state, the plug-in connections, situated at a defined distance from the first projection, extend into the positioning holes so that they are able to be contacted from the side of the plastic holder turned toward the subassemblies by the mating connections. The subassemblies are supported by way of a support part on the first projection, which is provided at a distance from the mating connections, which distance is made to conform with the distance between the projection and the plug-in connections on the subrack.

The described subrack is distinguished by its sandwich-type construction. The different components of the subrack, such as the bus boards and the plastic holder, feature the above-mentioned positioning means, which easily enable the stacking of layers in a predetermined manner and also permit an automatable manufacturing. Of course, the holes and projections used as positioning means, as well as the support part, can have a transposed configuration.

If the subassemblies on the side of the mating terminals possess a plastic part with the support part, and if the mating connections are secured to a printed-circuit board that has first holes, with which plugs of the plastic part mate, then the positional accuracy of the mating connections relative to the support part used as a positioning means is able to be attained, whereby this construction enables a manufacturing with automatic machines. If the first projection is a spring part, then variations resulting from the tolerances of the respective elements, due to the interaction of the various components of the subassemblies and of the subrack, are able to be equalized. This facilitates the joining of the plug-in and mating connections.

If the spring part is configured with such clearance from the plug-in connections that when the subassembly swivels over its support part, it is pressed so far down from the spring part that the top edge of the housing of the mating connections comes to rest below the top edge of the housing of the plug-in connections, then the plug-in and mating connections are able to be brought upwards, through the travel stroke of the spring part, into opposite positions and are then able to be simply, exactly and securely joined.

The plug-in connections are usually chamfered on their narrow sides to enable the mating connections to slide easily on to the plug-in connections.

Since the plug-in connections are designed as spring contact strips and the mating connections as terminal strips, it is possible to have a multitude of terminal connections within a narrow space.

If the plastic holder is modularly partitioned into several slot module locations, whereby at least one hole is assigned to each slot module location, then one is able to build a flexible electrical installation in this manner; in other words one that is adaptable to the technical requirements. For example, a subrack of a standard 19-inch width can be provided with 18 slot module locations.

The pivoting of the subassembly and consequently also the connection of the plug-in and mating connections are hereby facilitated, and the lateral mounting support for the subassembly in the pivoted state is improved by providing on the edge of each slot module location, a first recess with a form fit allowing for the subassembly. The form fit causes the subassembly to contact the first recess, at least in places, when it pivots and when in its pivoted state, as a result of the lateral guidance.

Providing subassemblies which are several times as wide as a slot module location and which contact the first recesses of several slot module locations in places makes it possible to equip the printed circuit boards of the subassemblies with components of larger dimensions as well, or to provide more than one printed circuit board per subassembly.

Furthermore, the mounting support for such subassemblies is likewise strengthened by means of the first recesses; this strengthening pertains to lateral stability in particular.

If the plastic part of the subassemblies is designed as an apron which projects at least partially around the terminal strips, then the mating connections are protected hereby in a simple manner against deformation. The dimensions of the protruding apron are adapted to the first recess, so that the apron is guided by this recess during swivelling. Subassemblies which are twice and many times as wide have a correspondingly wide apron, which embraces several first recesses during swivelling.

Due to the fact that the subrack has more than one bus board, the electrical installation, adapted to the requirements, can be built and operated with one or several bus boards, through which means an appropriate economical adaptation is possible.

By providing a pivotal mounting support, which is used to secure the subassemblies, on the plastic holder, the pivotal mounting support is not only able to be easily manufactured, but it can also act as a means to help improve the positional accuracy of the plug-in connections. By means of the pivotal mounting support provided on the plastic holder, one attains a fastening and mounting support for the subassembly which are independent of the dimensional tolerances of the profile plate used as a stabilizing rear holder.

If at least one grounding bar is provided between the plastic holder and the subrack, which grounding bar can be contacted by way of at least one opening in the plastic holder of the slot module location, then the grounded connection of the printed circuit board in the subassembly can be realized quickly and easily. If the grounding bar has protruding conductive contacts, which project through the openings to the terminal side of the subrack, then the contacting of the contacts can take place with counter-contacts mounted accordingly on the subassembly. The counter-contacts can be configured to abut closely on the subassembly and consequently to be protected from mechanical stress. One is able to achieve a cost-effective, simple manufacturing of the grounding bar with the contacts, when the contacts are configured as bent, for example crimped parts of the grounding bar. If the contacts are able to be connected to the grounding bar in an electrically conductive manner, then it is also possible to use contacts of a complicated type of construction, which can be manufactured more easily and cost-effectively by themselves, in adaptation to the required spatial form, than in a unit stipulated by the grounding bar.

It proves to be advantageous when the contacts are metal-tongue pairs, which are designed as side pieces of U-shaped parts, since they can be manufactured with minimal expenditure and easily installed on the plastic holder. If the subrack is composed of the plastic holder, a parallel-arranged holder, the bus board situated between this parallel holder and the plastic holder, and if these components possess means for positioning during the stacking of layers, then this represents a sandwich type of construction which is favorable for manufacturing, whereby the electrical and mechanical construction of the subrack is not adversely affected.

A favorable refinement consists in that a second hole is made to pass through the plastic holder, the subrack and through the grounding bar, in one line, and a metallic threaded bush can be plugged into this second hole from the plastic holder, whereby this threaded bush has a continuous thread and presses the grounding bar and the contacts from the rear of the subrack against the holder via this thread by means of a screw. The plastic holder, the grounding bar and the subrack are held together in a simple manner by means of the threaded bush plugged into the second hole. When the threaded bush has a hexagonal head and the plastic holder is provided at the entrance to the second hole with a cut-out in the form of the hexagonal head, the threaded bush can be introduced, so that it cannot turn, into the plastic holder. It also proves to be advantageous when the plastic holder has a cavity disposed toward the bus board, because this cavity can house structural elements that are directly connected to the bus board, for example.

If at least one of the subrack's slot module locations features a coding element, then only one subassembly with adapted coding can be connected here. By this means, one avoids connecting a non-fitting subassembly, which could possibly cause damage or malfunctions. If a second cut-out is provided on the plastic holder for receiving the coding element and if a spring element is available at the base of the second cut-out, then the coding element is able to be inserted so that it is recessed in the second cut-out, whereby the spring element presses the coding element, which is movable per se to equalize tolerances, into a defined position.

DETAILED DESCRIPTION

Figure 1:
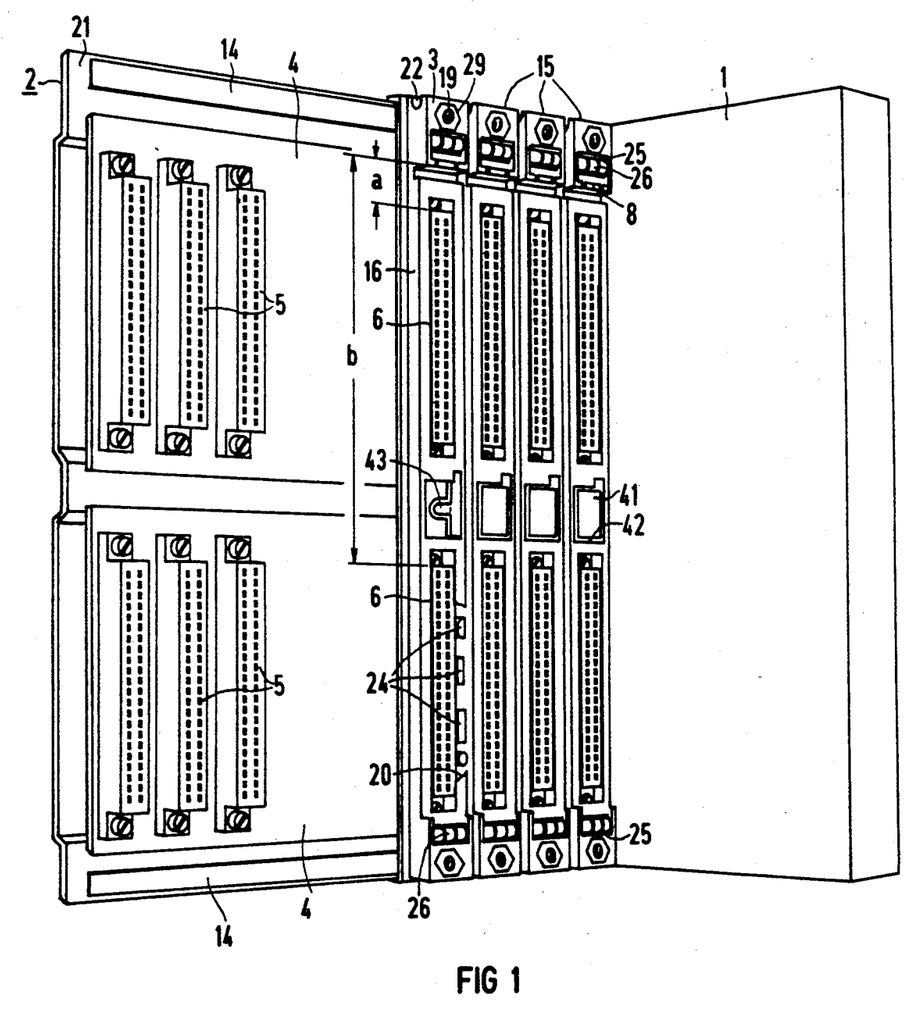
FIG. 1 illustrates a subrack with a pivoted subassembly, as well as with a plastic holder which has several slot module locations in accordance with a first embodiment of the present invention.
Figure 2:
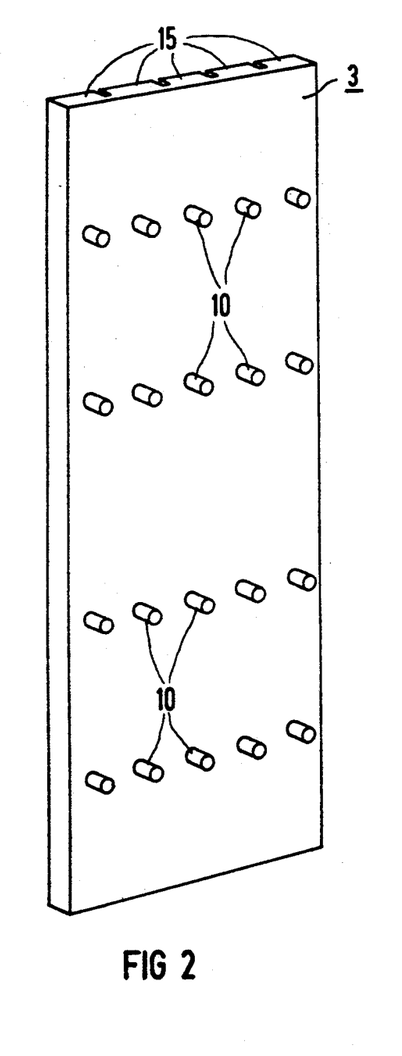
FIG. 2 illustrates the rear side of the plastic holder of FIG. 1.
Figure 3:
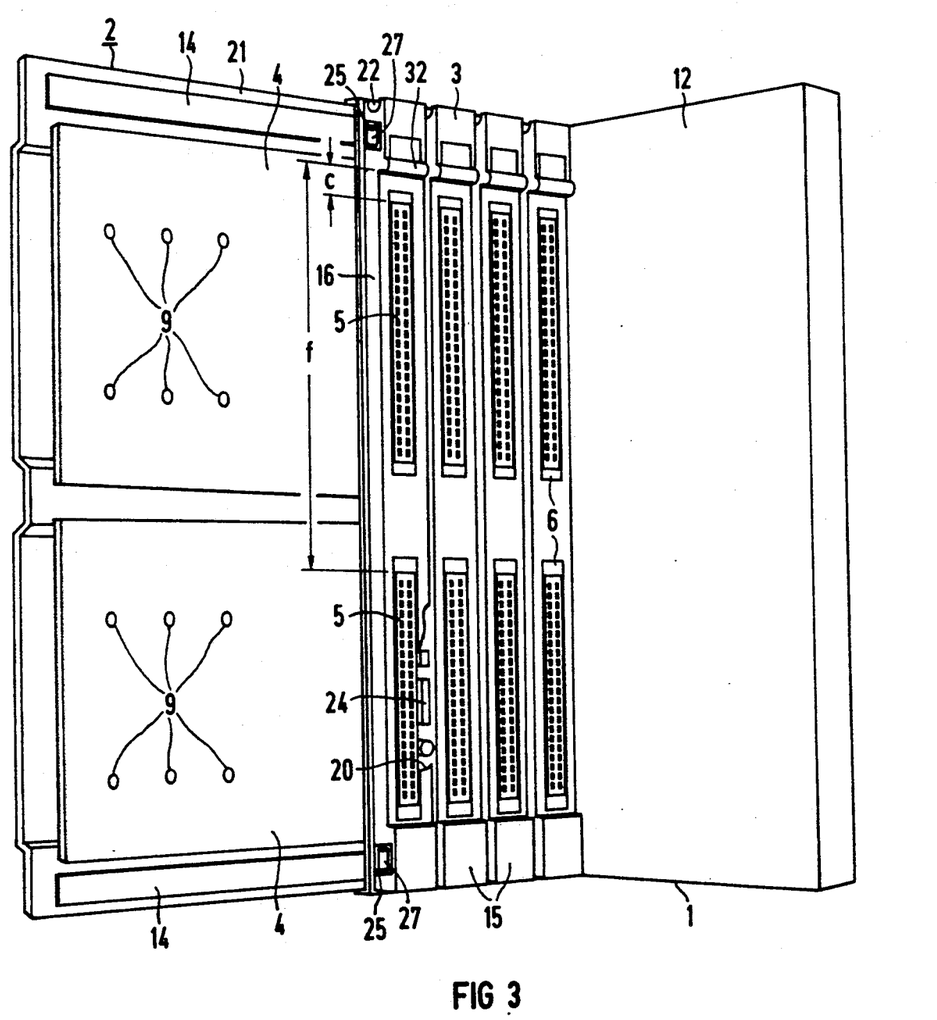
FIG. 3 illustrates an additional embodiment of a subrack.
Figure 4:
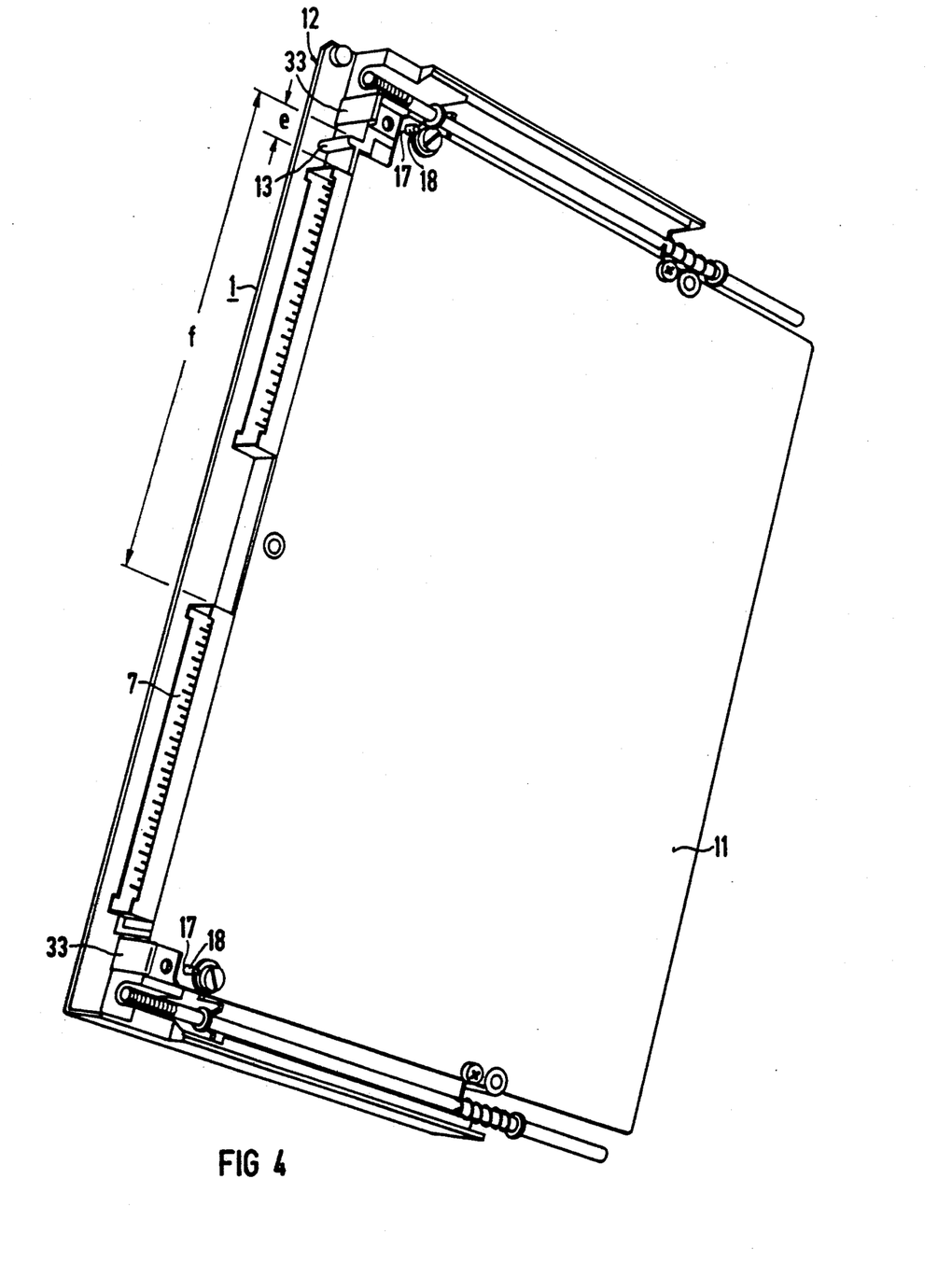
FIG. 4 illustrates a first subassembly with its side featuring the mating connections.

A subrack 2 comprised of an aluminum holder 21, of two bus boards 4 and one plastic holder 3, on which a subassembly 1 is supported, is apparent in FIG. 1. The bus board 4, which has the plug-in connections 5 positioned on it and attached to it with positional accuracy, is mounted on the aluminum holder 21. Here, spring contact strips 5 are used as plug-in connections. They make it possible to have a multitude of contact connections in a close space. The plastic holder 3, which is modularly partitioned into several slot module locations 15, is screwed on to the aluminum holder 21. Two rectangular holes 6, whose size and position are adapted to the dimensions and the position of the spring contact strips 5 to accommodate them, are assigned to each slot module location 15. When the plastic holder 3 is attached, it is positioned by means of its pin-shaped projections 10, as illustrated in FIG. 2, on the side turned away from the subassemblies next to the bus boards 4, over positioning holes 9 of the board 4 as illustrated in FIG. 3, in a way that allows the spring contact strips 5 to extend into the holes 6. In this manner, it is possible to connect the spring contact strips 5 to the mating connections of the subassemblies 1, whereby these mating connections are designed as terminal strips 7 as illustrated in FIG. 4.

A pivotal mounting support 22 on the plastic holder 3 is assigned to each slot module location 15. In the vicinity of this pivotal mounting support 22, there is a projection designed as a spring part 8. The design featuring a spring part 8 as a projection proves to be favorable, particularly for equalizing manufacturing tolerances. In the assembled state of the subrack 2, specific distances a, b exist between the spring part 8 used as a positioning means and the spring contact strips 5.

Grounding bars 14 run parallel to the external longitudinal sides of the two bus boards 4, between the plastic holder 3 and the aluminum holder 21, for connecting the external ground terminal for the screening and for the grounding conductor terminal. The grounding bars 14 have the shape of conductive bands or bars, which can be placed on the aluminum holder 21, but they can also be formed by the aluminum holder 21 itself.

The edge of each slot module location 15 is provided with a recess 16. The recess 16 has a cavity 20 disposed toward the bus board 4, and this cavity can house structural elements 24 which can be electrically connected to the bus board 4. In this manner, the structural elements 24 are protected by the recess 16 from external mechanical effects.

Figure 8:
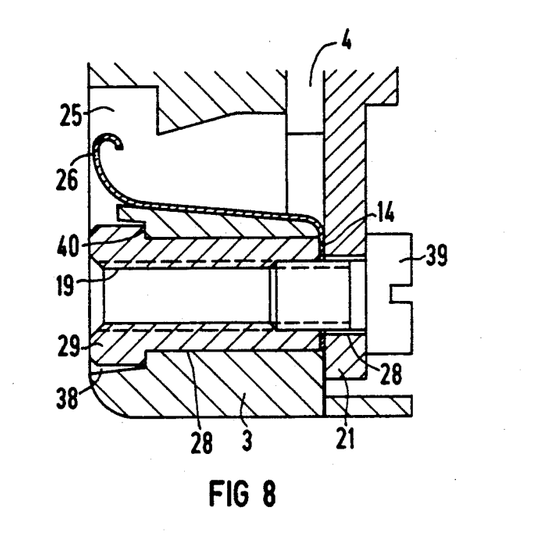
FIG. 8 illustrates a partial section through the subrack.

In the plastic holder 3 of the slot module location 15, openings 25 are provided in the vicinity of the grounding bars 14. Contacts 26, in the form of fingers, protrude through the openings 25 to the terminal side of the subrack 2. Here, the contacts 26 conform as bent, curved fingers, to the grounding bars 14. A hole 28 passes through the plastic holder 3, the aluminum holder 21 and through the grounding bar 14, in one line. A threaded bush 29, which has a hexagonal head and is provided with a recess and a continuous internal screw thread 19, can be plugged into this hole 28 from the plastic holder 3. This is illustrated in greater detail in FIG. 8. According to FIG. 8, the threaded bush 29 features a recess 40 between its shank and the hexagonal head and has a flat surface at the end of the shank. The shank is adapted in its diameter to that of the hole 28. The threaded bush 29 is situated with its hexagonal head in an appropriately designed cut-out 38 in the plastic holder 3 at the entrance of the hole 28, through which means the threaded bush 29 is locked so that it cannot turn. The flat surface of the threaded bush 29 at the end of the shank rests, with the contacts 26, on the grounding bar 14 situated between the plastic holder 3 and the aluminum holder 21 and, when the threaded bush 29 is tightened, the flat surface presses the grounding bar 14 against the aluminum holder 21 by means of a screw 39 introduced into the thread at the rear of the aluminum holder 21. The plastic holder 3 with the aluminum holder 21 and the bus boards 4 are also held together thereby because of the recess 40.

In addition, at each slot module location 15 in the middle area of the plastic holder 3, FIG. 1 shows a cut-out 42, which serves to accommodate a coding element 41. Only coded subassemblies 1 adapted accordingly to this respective coding element 41 are thus able to be plugged into the slot module locations 15, through which means one avoids damages or malfunctions at the subrack 2 or at the subassembly 1 resulting from a mistakenly made, wrong connection. A spring element 43, which improves the connection of the coded subassembly 1, is provided at the base of the cut-out 42; then, to equalize unavoidable tolerances, the coding element 41 is movably supported in the out-out 42, whereby the spring element 43 presses the coding element 41 into a defined position.

Figure 5:
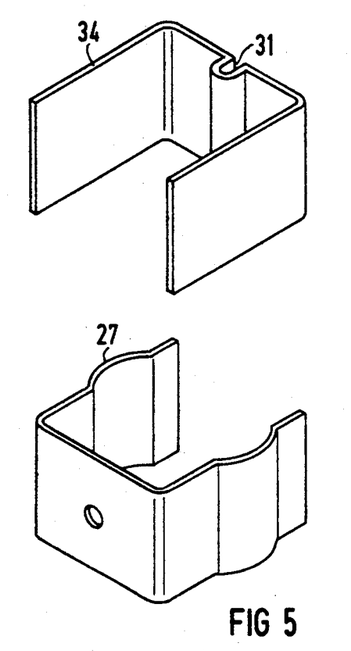
FIG. 5 illustrates a U-shaped spring and a corresponding metal-tongue pair.

As an alternative to the specific embodiment depicted in FIG. 1, FIG. 3 illustrates a slot module location 15 of the plastic holder 3, where openings are provided as slot pairs 25 at the edge of the recess 16 in the vicinity of the grounding bars 14. A metal-tongue pair 27 such as that illustrated in FIG. 5 is plugged into each slot pair 25.

The metal-tongue pair 27 rests with its segment connecting the two tongues, directly contacting, on the respective grounding bar 14. Moreover, instead of the spring part 8 in the case of the specific embodiment according to FIG. 1, the slot module location 15 possesses a projection in the form of a rounded-off lip 32, which lies at fixed distances c, d from the spring contact strips 5. However, the safe, damage-protected meeting of the plug-in 5 and mating connections 7, shown in FIG. 6, in this specific embodiment assumes relatively small manufacturing tolerances or resistant designed plug-in 5 and mating connections 7.

FIG. 4 shows a part of the subassembly 1, which is assigned to the specific embodiment according to FIG. 1. Here, the terminal strips 7 are attached to a printed circuit board 11 which belongs to the subassembly 1 and has holes 17, with which plugs 18 of the plastic part 12 mate. The plastic part 12 is designed toward the terminal side as an apron which mechanically protects the housing of the terminal strips 7. On the one narrow side of the subassembly 1, a segment 13 which conforms to the spring part 8 of the plastic part 3 is provided as a support part, which enables the subassembly 1 to be positioned on the subrack 2 during pivoting. The positioning of the terminal strips next to the spring contact strips 5 in accordance with the desired objective is thus guaranteed in that corresponding distances e, f also existing between the segment 13 and the terminal strips 7 conform to the distances a, b between the projection 8 and the spring contact strips 5 according to FIG. 1. The distances are selected among themselves, so that when the subassembly swivels downwards, the upper edge of the border of the terminal strips 7 rests in any case somewhat below the upper edge of the opposite housing of the spring contact strips 5. Since the latter housing edge is usually chamfered, the subassembly 1 with the border of the terminal strips 7 slides automatically on to the housing of the spring contact strips 5, through which means the blades terminals and the springs contact each other. As already indicated above, this type of construction with an equalizing spring part 8 is suited when one expects larger deviations between the setpoint and actual dimensions. A metal bracket 33, which contacts the contact piece 26 of the grounding bar 14 protruding out of the corresponding opening 25 when the subassembly 1 is connected to the slot module location 15, is situated on the narrow sides of the subassembly 1, above the upper terminal strip 7 and below the lower terminal strip 7.

Figure 6:
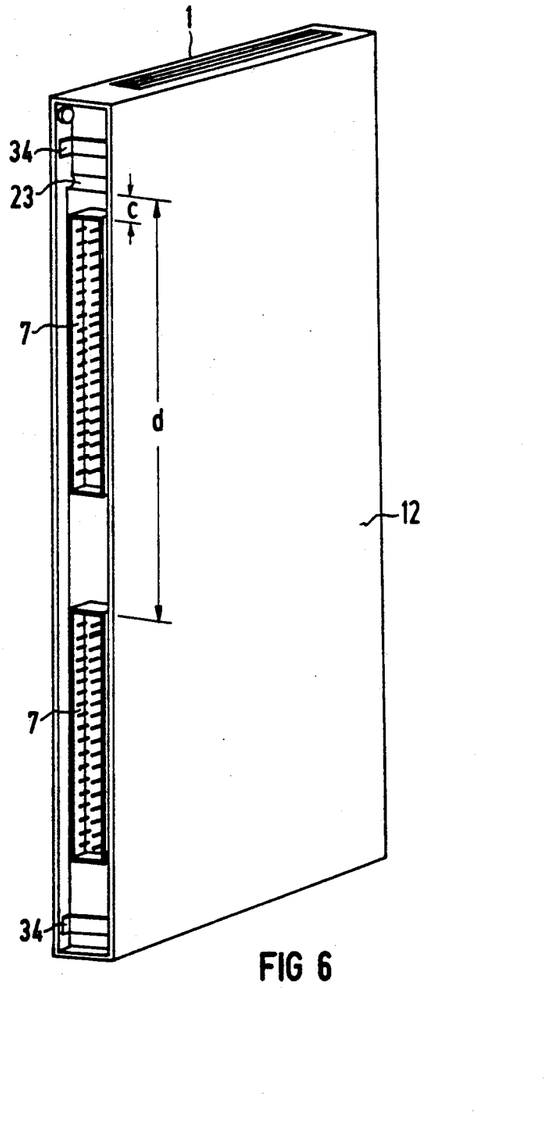
FIG. 6 illustrates an additional embodiment of the subassembly with its side featuring mating connections.

FIG. 6 shows the design of the subassembly 1 for types of construction with comparatively small dimensions and accordingly with attainable small manufacturing tolerances. On its side to be swivelled toward the subrack 2, it features a plastic part 12, which deviates, however, from that of the subassembly 1 according to FIG. 4.

The distances c, d exist between the rounded-off lip 32 according to FIG. 3 and the spring contact strips 5. The plastic part 12 of the subassembly 1 according to FIG. 6 is provided on the one narrow side with a recess 23 which conforms to the rounded-off lip 32 of the slot module location 15. The latter recess features the distances c, d from the terminal strips 7. This ensures that the blades and springs of the spring contact strips 5 and of the terminal strips 7 are joined true-to-size. However, is the distances c, d of the rounded-off lip 32 from the spring contact strips 5 deviate from the setpoint values, then the corresponding recess 23 used for support in the plastic part 12 of the subassembly 1 should lie so far away from the terminal strips 7, that, as in the previous design with the spring part 8, when the subassembly 1 is swivelled down, the upper edge of the border of the terminal strips 7 rests in any case somewhat below the upper edge of the opposite housing of the spring contact strips 5. The lifting of the subassembly 1, which is then required to join the terminal strips 7 and the spring contact strips 5, can be guaranteed by providing the recess 23 with adequate downward clearance.

The connection of the printed circuit board, not shown here, in the subassembly 1 according to FIG. 6 to the grounding bar 14 is accomplished via U-shaped springs 34 illustrated in FIG. 5, with a grounded connection means 31. These U-shaped springs are fastened to both outer narrow sides of the terminal strips 7 and, when the subassembly 1 is in its swung-in state next to the subrack 2, they embrace the metal tongue pairs 27 according to FIG. 3, making contact on both sides. By having a short distance between the one metal tongue pair 27 and the pivotal center of the pivotal mounting support 22, the subassembly 1 initially contacts the grounding bar 14, before the other contacts are connected between the terminal strips 7 and the spring contact strips 5. This applies likewise to the previously described specific embodiment of subassembly 1 according to FIG. 4. This represents a measure that would improve protection for the subassemblies.

The previously described positioning by means of projections and adapted recesses can also be achieved, however, by transporting their respective positions.

As an alternative to the spring contact strips 5 in connection with the holes 6 on the plastic holder 3, individual springs can also be used, which are inserted, however, into holes in the plastic holder 3 designed accordingly for this, so that the spring-contact-strip housings 5 are replaced in this manner.

Figure 7:
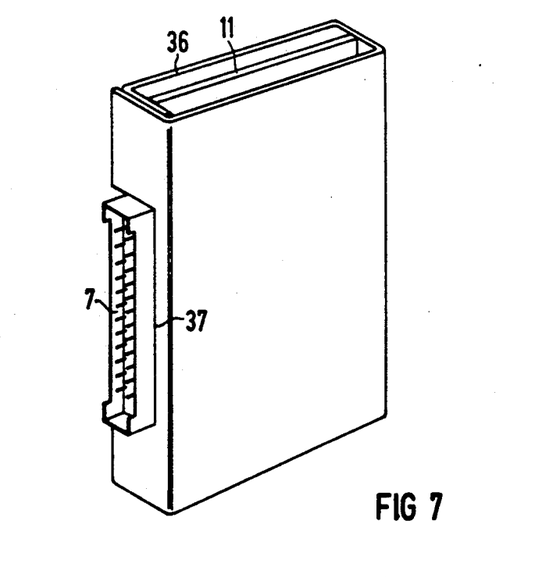
FIG. 7 illustrates a printed circuit board with screening.

FIG. 7 illustrates a printed circuit board 11 of a subassembly 1, around whose periphery a metal-sheet plate 36 is placed to shield against electrical fields. At its ends which, for example, are overlapped or thrust together, the metal-sheet plate 36 possesses, in the vicinity of the mating connections 7, an adapted cutaway portion to accommodate the same. The metal-sheet plate 36 is electrically connected to at least one of the two U-shaped springs 34 according to FIG. 6 or to the metal brackets 33 of the subassembly 1 according to FIG. 4.

What is claimed is:
1. An electrical installation comprising:
a subassembly;
a subrack,
said subrack comprising
a bus board including secured plug-in connections;
swivel means for electrically connecting said plug in connections to mating connections of the subassembly being mechanically retained at the subrack by said swivel means,
a plastic holder including at least one hole to accommodate said plug-in connections;
at least one first projection being provided on the plastic holder at a defined distance from said at least one hole;
said bus board including at least two positioning holes at a defined distance from said plug-in connections;
said plastic holder further including at least two second projections adapted in position and shape to said positioning holes on a side of said plastic holder turned away from the subassembly;
said second projections and positioning holes being positioned, so that in their joined state, the plug-in connections, situated at a defined distance from the first projection, extend into at least one first hole and are able to be contacted from said side of said plastic holder turned toward the subassembly by the mating connections,
said subassemblies being supportable over a support part on said at least one first projection, which is provided at a distance from the mating connections, said distance from the mating connection conforming with a distance between said at least one first projection and said plug-in connections on the subrack.

2. The electrical installation according to claim 1, wherein a side of the subassembly including the mating terminals includes a plastic part including plugs with the support part, said mating connections being secured to a printed-circuit board that has first holes, with which said plugs of the plastic part mate.

3. The electrical installation according to claim 1, wherein said at least one first projection comprises a spring part.

4. The electrical installation according to claim 3, wherein said spring part is configured with such a clearance from the plug-in connections that when the connection is pressed so far down from the spring part that the top edge of the housing of the mating connections comes to rest below the top edge of the housing of the plug-in connections.

5. The electrical installation according to claim 1, wherein said plug-in connections comprise spring contact strips and the mating connections comprise terminal strips.

6. The electrical installation according to claim 3, wherein said plug-in connections comprise spring contact strips and the mating connections comprise terminal strips.

7. The electrical installation according to claim 1, wherein said plastic holder is modularly partitioned into several slot module locations, and there are a plurality of said first holes, one of said first holes being assigned to each slot module location.

8. The electrical installation according to claim 3, wherein said plastic holder is modularly partitioned into several slot module locations, and there are a plurality of said first holes, one of said first holes being assigned to each slot module location.

9. The electrical installation according to claim 5, wherein said plastic holder is modularly partitioned into several slot module locations, and there are a plurality of said first holes, one of said first holes being assigned to each slot module location.

10. The electrical installation according to claim 7, wherein on the edge of each slot module location, there is a first recess with a form fit allowing for the contact the first recess, at least in places, when it pivots and when in its pivoted state.

11. The electrical installation according to claim 10, wherein the subassembly is at least twice as wide as one slot module location and contacts the first recesses of several slot module locations in places.

12. The electrical installation according to claim 1, wherein said plastic part of the subassembly is designed as an apron which projects at least partially around the mating connections.

13. The electrical installation according to claim 3, wherein said plastic part of the subassembly is designed as an apron which projects at least partially around the mating connections.

14. The electrical installation according to claim 7, wherein said plastic part of the subassembly is designed as an apron which projects at least partially around the mating connections.

15. The electrical installation according to claim 10, wherein said plastic part of the subassembly is designed as an apron which projects at least partially around the mating connections.

16. The electrical installation according to claim 1, wherein said subrack comprises at least two bus boards.

17. The electrical installation according to claim 1, wherein said plastic holder includes a pivotal mounting support, which is used to secure the subassembly, provided thereon.

18. The electrical installation according to claim 1, further comprising at least one grounding bar provided between the plastic holder and the subrack, said grounding bar can be contacted by way of at least one opening in the plastic holder of the slot module location.

19. The electrical installation according to claim 18, wherein said grounding bar includes protruding conductive contacts, which project through the openings to the terminal side of the subrack.

20. The electrical installation according to claim 19, wherein said contacts are configured as bent parts of the grounding bar.

21. The electrical installation according to claim 19, wherein said contacts are connectable to the grounding bar in an electrically conductive manner.

22. The electrical installation according to claim 21, wherein said contacts includes metal-tongue pairs, constituting side pieces of U-shaped parts.

23. The electrical installation according to claim 1, wherein said subrack comprises said plastic holder, a parallel-arranged holder and of said bus board situated between said parallel holder and the plastic holder, and means for positioning said plastic holder, said parallel-arranged holder and said bus board during stacking of these components.

24. The electrical installation according to claim 18, further comprising a second hole passing through said plastic holder, the subrack and through the grounding bar, in one line, and a metallic threaded bush, plugged into this second hole from the plastic holder, whereby said threaded bush has a continuous thread and presses the grounding bar and the contacts from the rear of the subrack against the holder via said thread by means of a screw.

25. The electrical installation according to claim 24, wherein said threaded bush has a hexagonal head and said plastic holder is provided at the entrance to the second hole with a first cut-out in the form of the hexagon head.

26. The electrical installation according to claim 1, wherein said plastic holder includes a cavity disposed toward the bus board.

27. The electrical installation according to claim 7, wherein at least one of said slot module locations features a coding element.

28. The electrical installation according to claim 27, wherein a second cut-out is provided on the plastic holder, said second cut-out receiving the coding element and wherein a spring element is available at the base of said second cut-out.

* * * * *